United States Patent
Fitzgibbon et al.

(10) Patent No.: US 9,177,430 B2
(45) Date of Patent: Nov. 3, 2015

(54) MOVEABLE BARRIER OPERATOR TRANSLATION SYSTEM AND METHOD

(75) Inventors: James J. Fitzgibbon, Batavia, IL (US); David Thomas Mack, Naperville, IL (US); Larry Strait, Glen Ellyn, IL (US); Robert Keller, Jr., Park Ridge, IL (US)

(73) Assignee: The Chamberlain Group, Inc., Elmhurst, IL (US)

( * ) Notice: Subject to any disclaimer, the term of this patent is extended or adjusted under 35 U.S.C. 154(b) by 1838 days.

(21) Appl. No.: 11/948,581

(22) Filed: Nov. 30, 2007

(65) Prior Publication Data

US 2009/0140836 A1 Jun. 4, 2009

(51) Int. Cl.
*G01S 15/00* (2006.01)
*G07C 9/00* (2006.01)

(52) U.S. Cl.
CPC .. *G07C 9/00182* (2013.01); *G07C 2009/00793* (2013.01); *G07C 2009/00928* (2013.01)

(58) Field of Classification Search
CPC ........... G07C 2009/00793; G07C 2009/00928; G07C 9/00182
USPC ......... 340/5.7, 5.71, 5.72, 5.26, 5.22, 825.39, 340/825.72, 825.69, 7.25, 902, 426.16; 455/41.2, 420
See application file for complete search history.

(56) References Cited

U.S. PATENT DOCUMENTS

| | | | |
|---|---|---|---|
| 6,333,698 B1 | 12/2001 | Roddy | |
| 6,362,771 B1 | 3/2002 | Schofield et al. | |
| 6,525,645 B2 | 2/2003 | King et al. | |
| 7,142,849 B2* | 11/2006 | Neuman | 455/420 |
| 7,183,940 B2* | 2/2007 | Chuey | 340/12.23 |
| 7,589,615 B2* | 9/2009 | Keller et al. | 340/5.64 |
| 2006/0012461 A1 | 1/2006 | Tsui | |
| 2006/0026520 A1 | 2/2006 | Gregori | |
| 2006/0109079 A1 | 5/2006 | Mack | |
| 2006/0220806 A1* | 10/2006 | Nguyen | 340/426.36 |
| 2006/0290489 A1 | 12/2006 | Brookbank | |
| 2007/0076645 A1 | 4/2007 | Vandrunen | |

OTHER PUBLICATIONS

International Search Report Dated Jun. 17, 2009 from PCT Patent Application No. PCT/US2008/084028.

(Continued)

*Primary Examiner* — Steven Lim
*Assistant Examiner* — Omeed Alizada
(74) *Attorney, Agent, or Firm* — Fitch Even Tabin & Flannery LLP (57) ABSTRACT

A system includes a translator device that is configured to receive, using a pre-programmed native mode of operation, a first barrier actuation code transmitted by a transmitter according to a first code format. The translator device then analyzes the first barrier actuation code and verifies that it is a valid code. When a valid code, the translator device saves the information contained in the code, and creates a second barrier actuation code at least in part from information contained in the first actuation code and transmits the second barrier actuation code according to the second code format, which is different from the first code format. A barrier operator is coupled to the translator device and a barrier. The barrier operator has a receiver apparatus and the receiver apparatus receives the second barrier actuation code. The barrier operator determines whether the second barrier actuation code is valid, and when the barrier actuation code is determined to be valid, actuates the barrier.

24 Claims, 3 Drawing Sheets

(56) References Cited

OTHER PUBLICATIONS

Deposition Upon Oral Examination, vol. I; US District Court—Western District of Washington at Tacoma; Case No. C09-5438 BHS; Jul. 7, 2010.

Motion in Limine—Oral Argument Requested; US District Court—Western District of Washington at Tacoma; Case No. C09-5438 BHS; Oct. 21, 2010.

Defendant's Opposition to Plaintiff's Motion in Limine; US District Court—Western District of Washington at Tacoma; Case No. C09-5438 BHS; Nov. 23, 2010.

Jan. 7, 2011 Opposition to Chamberlain's Motion to Exclude Evidence of Chamberlain's Use of IEI Intellectual Property; US District Court—Western District of Washington at Tacoma; Case No. C09-5438 BHS.

Plaintiff's Supplemental Brief Regarding Chamberlain's Patent Applications; US District Court—Western District of Washington at Tacoma; Case No. C09-5438 BHS; Jul. 7, 2011.

Transcript of Proceedings Before the Honorable Benjamin H. Settle United States District Judge; US District Court—Western District of Washington at Tacoma; Case No. C09-5438 BHS; Dec. 15, 2010.

Plaintiff's Motion in Limine; US District Court—Western District of Washington at Tacoma; Case No. C09-5438 BHS; Nov. 15, 2010.

Plaintiff's Brief in Opposition to Defendant's Motion in Limine; US District Court—Western District of Washington at Tacoma; Case No. C09-5438 BHS; Nov. 1, 2010.

Declaration in Support of Response to Motion in Limine; US District Court'Western District of Washington at Tacoma; Case No. C09-5438 BHS; Nov. 1, 2010.

Declaration in Support of Motion in Limine; US District Court—Western District of Washington at Tacoma; Case No. C09-5438 BHS; Oct. 21, 2010.

Canadian Patent Application No. 2,708,257; Office Action Dated Jun. 5, 2015.

\* cited by examiner

MOVEABLE BARRIER OPERATOR TRANSLATION SYSTEM AND METHOD

FIELD OF THE INVENTION

The field of the invention relates to moveable barrier operators and, more specifically, to the actuation of these systems.

BACKGROUND

Different types of moveable barrier operators have been sold over the years and these barrier operator systems have been used to actuate various types of moveable barriers. For example, garage door operators have been used to move garage doors and gate operators have been used to open and close gates.

Such barrier movement operators may include various mechanisms to open and close the barrier. For instance, a wall control unit may be coupled to the barrier movement operator and send signals to a head unit thereby causing the head unit to open and close the barrier. In addition, operators often include a receiver unit at the head unit to receive wireless transmissions from a hand-held code transmitter or from a keypad transmitter, which may be affixed to the outside of the area closed by the barrier or other structure.

Some vehicles include a transmitter or transceiver that is affixed to or incorporated directly into the structure of the vehicle. These transmitters are used by users in their vehicles to actuate moveable barrier operators such as garage door operators. After being actuated by the transmitter, the moveable barrier operator then operates the barrier as directed by the transmitter.

Incorporating the transmitter into the structure of the vehicle provides several advantages. For example, when incorporated into the structure of the vehicle, the transmitter is typically directly connected to the power source of the vehicle thereby assuring an adequate and constant supply of power to the transmitter. Securing the transmitter into the structure of the vehicle also helps prevent damage to or loss of the transmitter.

While offering several advantages, these previous built-in transmitter systems also suffered from several disadvantages. Moveable barrier operators are often actuated by codes and the older codes used by these moveable barriers are sometimes changed or updated with new codes to provide better security. A user may also replace an old barrier operator with a new barrier operator that operates using new codes. Unfortunately, when new codes or code formats are used by the barrier operator and the old codes are still retained at the transmitters, the transmitter/barrier operator system will not be able to function properly together due to the code mismatch.

Some previous systems have attempted to circumvent these shortcomings by using an activator device that was coupled to the transmitter. When a specific code was received, the activator device sent a signal to activate the original transmitter. However, these systems proved to have security risks when used within vehicles. More specifically, when the activator device was placed in a vehicle, a thief could easily remove the transmitter from the activator device in the vehicle and then enter the protected area. In some cases, the activator device was placed securely inside the house of a user, but this prevented the transmitter from being used with other operators at other locations such as a summer home. Additionally, these previous systems required that a complicated electronic or mechanical interface be provided between the activator device and the transmitter.

Code translators were also used in previous systems in an attempt to overcome the above-mentioned problems. However, all of these previous code translators needed to first learn the codes from the transmitter before they could properly function. Additionally, these previous code translators proved time-consuming to implement (e.g., often requiring complicated user input and instructions) and, in any case, might not be effective in achieving the desired results.

SUMMARY

Approaches are provided whereby a transmitter is used in association with a moveable barrier operator and operates effectively with the movable barrier operator to control movement of a barrier even when the codes or code formats of the moveable barrier operator are updated or changed. The approaches described herein are easy and cost-effective for users to implement, use and maintain. In addition, the approaches described herein provide increased security levels required by users. Furthermore, the approaches described herein can easily be incorporated into existing systems without the need to extensively modify or re-program elements of these existing systems.

In many of these embodiments, a system for translating codes from a first format to operate a barrier operator system includes a translator device. The translator device is configured to receive, using a pre-programmed native mode of operation, a first barrier actuation code transmitted by a transmitter according to a first code format. The translator device then analyzes the first barrier actuation code according to the first code format and verifies that the first barrier actuation code is a valid code. When the first barrier actuation code is verified to be a valid code, the translator device saves the information contained in the code, and creates a second barrier actuation code from information contained in the first barrier actuation code. The translator device then transmits the second barrier actuation code according to the second code format, which is different from the first code format.

A barrier operator is coupled to the translator device and a barrier. The barrier operator has a receiver apparatus and the receiver apparatus receives the second barrier actuation code transmitted according to the second code format from the translator device. The barrier operator determines whether the second barrier actuation code (transmitted according to the second code format) is valid, and when the second barrier actuation code is determined to be valid, actuates the barrier.

The translator device may be coupled to various types of power sources. In one example, the translator device is coupled to and powered by the power source of a vehicle where the translator device is located. In another example, the translator device includes its own power source (e.g., a battery).

The first and second code formats may include a variety of different formats. For example, the first and second code formats may be in a trinary format, rolling code format, fixed code format, or Manchester format. Other examples of formats are possible.

The first and second barrier actuation codes may also be transmitted at various frequencies. In one example, the first barrier actuation code is transmitted at a first frequency and the second barrier actuation code is transmitted at a second frequency. In another example, the first and second barrier actuation codes may be transmitted at the same frequency.

The first and second barrier actuation codes may also be structured to include different portions or segments. In one example, the first barrier actuation code includes a fixed portion and the second barrier actuation code includes at least one portion derived from the fixed portion. In another example, the first barrier actuation code includes a rolling portion and the second barrier actuation code includes at least a portion derived from the rolling portion. Other examples of portions and approaches for deriving the second code are possible.

Thus, approaches are provided that permit a transmitter to work with a moveable barrier operator even as the codes or code formats of the moveable barrier operator are updated or changed. The approaches described herein are easy and cost-effective to implement, use, and maintain. Additionally, these approaches allow for security improvements to be implemented in the system without adversely impacting system performance.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

Description

Figure 1:
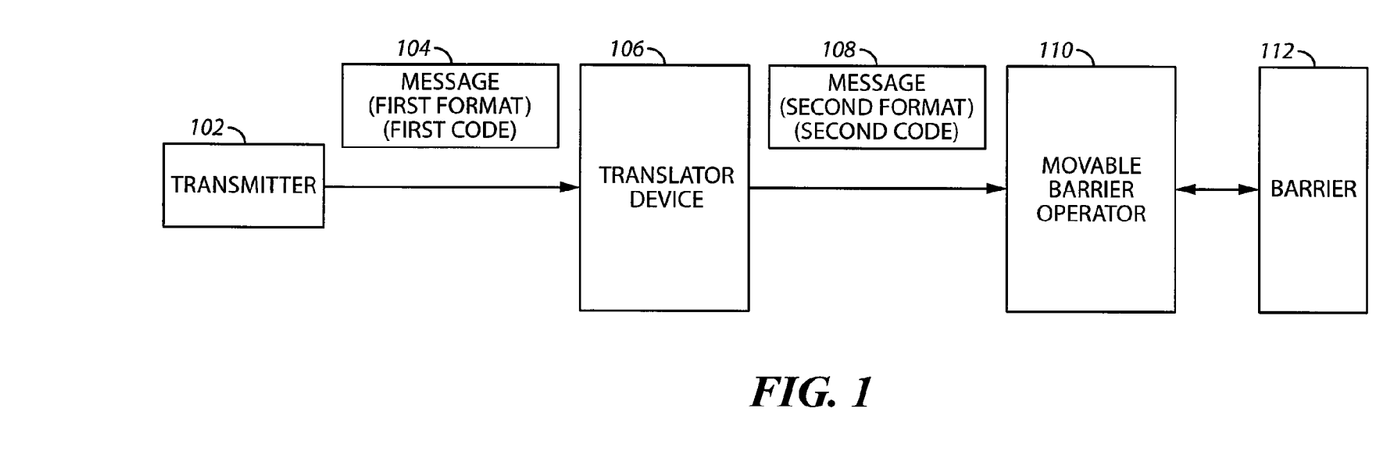
FIG. 1 comprises a block diagram showing a system for translating codes according to various embodiments the present invention.

Referring now to FIG. 1, one example of approaches for performing code translation in a moveable barrier operator system is described. A transmitter 102 transmits a first message 104 to a translator device 106. The first message 104 is transmitted according to a first format and includes a first barrier actuation code. The translator device 106 receives the first message 104, interprets the first message 104 according to the first format, extracts information from the first message 104 (e.g., the first barrier actuation code), and forms a second message 108.

The transmitter 102 is any type of transmitter device that is used to actuate any type of moveable barrier operator. In one example, the transmitter 102 is a portable transmitter used in a vehicle. For instance, the transmitter 102 may be a portable hand-held device or incorporated into the structure of the vehicle. In other examples, the transmitter 102 may be affixed to a wall or other building structure. Other examples of the physical placement or positioning of the transmitter 102 are possible.

Similarly, the translator device 106 may be positioned at various locations. For instance, the translator device 106 may be located within the same housing or general area of the transmitter 102 (e.g., within the same vehicle as the transmitter 102). In other examples, the transmitter 102 and the translator device 106 are located at different locations. As with the transmitter 102, the translator device 106 is not limited in physical placement and can be located at any location (e.g., within a vehicle or within or attached to a garage or house, to name a few examples).

The translator device 106 performs the above-mentioned processing of the first message 104 (and the first barrier actuation code contained therein) without performing any type of learning operation or entering any type of learning mode. In other words, the processing functions described above are pre-programmed into the translator device 106. Those skilled in the art will appreciate and understand that, as used herein, "pre-programmed" refers to programming steps and/or utilized data and operational parameters that are present and available to the platform without the need for an end user to enter such content or for the platform to acquire such content via a learning mode of operation. Accordingly, for example, it will be understood that this expression does not refer to a translator device having an ability to receive a new code transmission during a learning mode of operation and to extract from that transmission new information that can be used in the future to recognize and convert that code transmission into a different relayed transmission.

It will also be appreciated that the translator device 106 can be re-programmed at any time with new translation approaches. In this regard, a port or ports may be provided to allow new information or translation approaches to be programmed into the translator device 106.

The second message 108 includes a second barrier actuation code and the second barrier actuation code is created by using at least in part the first barrier actuation code and/or other information contained in the first message. For example, the first barrier actuation code may have a rolling portion and/or a fixed portion. A second barrier actuation code may be created with some or all of the fixed portion of the first barrier actuation code and/or some or all of the rolling portion of the first barrier actuation code.

The second message 108 (including the second barrier actuation code) is then transmitted according to a second format from the translator device 106 to the moveable barrier operator 110. The moveable barrier operator 110 receives the second message 108, validates the second barrier actuation code, and operates a barrier according to the second barrier actuation code in the second message 108.

The moveable barrier operator 110 may be any type of moveable barrier operator. For example, the moveable barrier operator 110 may be a garage door operator, gate operator, or an operator that moves shutters. Similarly, the barrier 112 may be any type of moveable barrier. For example, the barrier 112 may be a garage door, a sliding gate, a swinging gate, or shutters. Other types of operators and barriers are possible.

The first and second code formats may include any number of formats having a variety of characteristics. For example, the formats may be a trinary format, a rolling code format, a fixed code format, or a Manchester format. Other examples of formats are possible. Additionally, the first message may be transmitted at a first frequency and the second message may be transmitted at a second frequency. Alternatively, the first message and the second message may be transmitted at the same frequency.

In one approach, the translator device 106 is pre-programmed to automatically choose a second format. Alternatively, the choice of the second format may be dynamic and based upon a variety of different factors. In this case, the translator device 106 may receive messages in a variety of formats and dynamically select the second format based upon different factors. For example, the second format choice may be based upon the first format, the time of day, and/or various security considerations, to name a few.

The translator device 106 can be powered in any number of different ways. In one example, when it is placed in a vehicle, the translator device 106 may be powered by the vehicle's power supply system. In another example, the translator device 106 may be affixed to a building and use the building's power supply. In still another example, the translator device 106 may have its own power supply (e.g., a battery). Other power sources may also be used.

Figure 2:
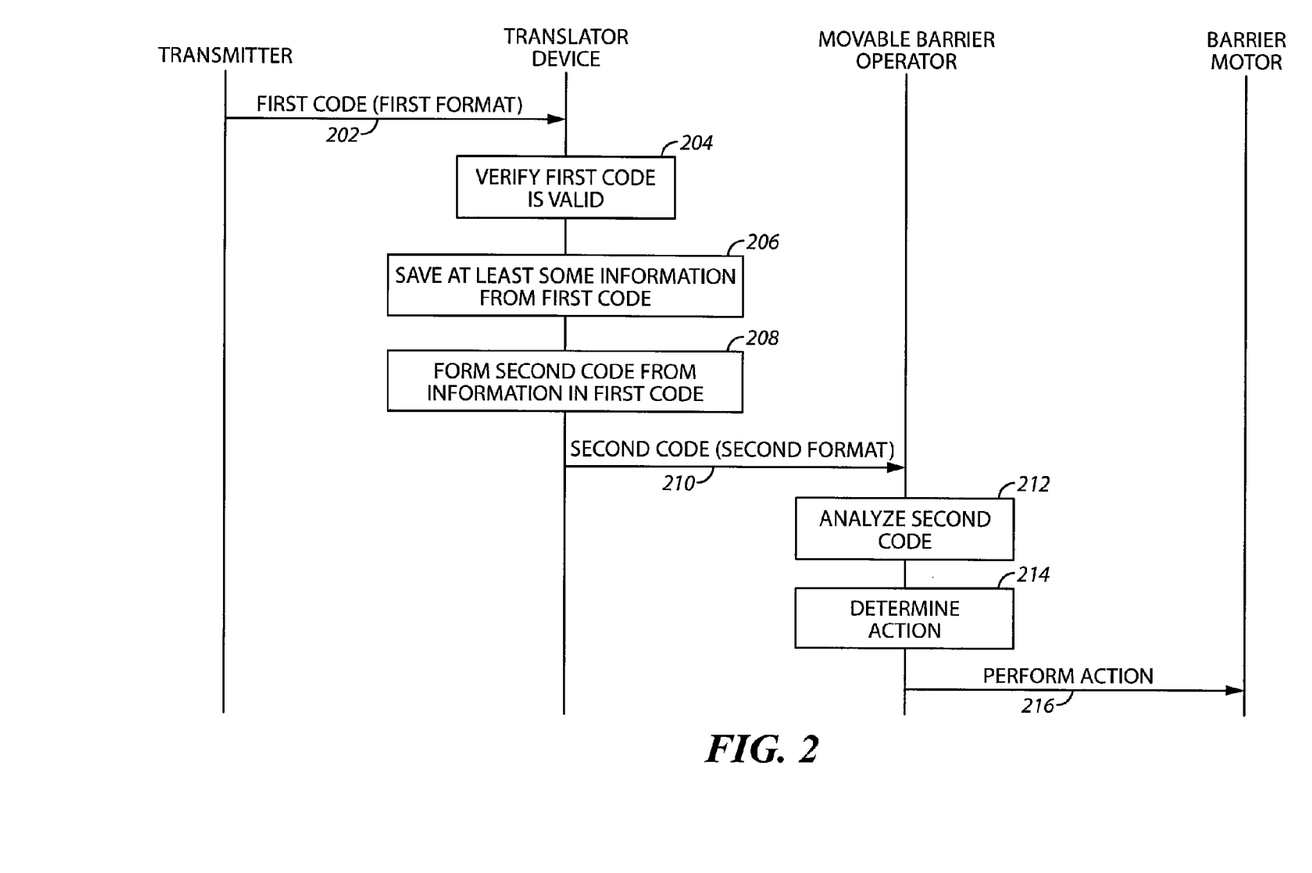
FIG. 2 comprises a diagram showing the translation of code formats according to various embodiments of the present invention.

Referring now to FIG. 2, one example of the use of a translator device to translate codes as between a transmitter and moveable barrier operator is described. At step 202, a first barrier actuation code with a first code format is transmitted from a transmitter to a translator device. At step 204, the translator device verifies that the first barrier actuation code is a valid code. If the code is invalid, then execution may end or an error condition/report may be created or generated. On the other hand, if the code is found to be valid, execution continues with step 206.

At step 206, the first barrier actuation code is examined and at least some information is saved from the first barrier actuation code. For example, the first barrier actuation code may be analyzed and portions of the first barrier actuation code and/or information represented by portions of the first barrier actuation code may be extracted and stored in a memory device. At step 208, a second barrier actuation code is formed from information contained in the first barrier actuation code. The formation of the second barrier actuation code may follow any approach or procedure to determine and/or select the second barrier actuation code from information included in or with the first barrier actuation code.

At step 210, the second barrier actuation code is transmitted according to a second format from the translator device to a moveable barrier operator. The transmission of the second barrier actuation code may utilize the same or a different transmission frequency than used to transmit the first code at step 202.

At step 212, the moveable barrier operator receives the transmission that includes the second barrier actuation code and analyzes the second barrier actuation code. The analysis may include validating the second barrier actuation code. At step 214, an action is determined based upon an analysis of the second barrier actuation code. For example, the action may be to open, close, or halt movement of a barrier. At step 216, a signal is sent to the motor of the barrier operator to perform the action. For example, the motor of the barrier operator may be activated to open the barrier if the action is to open the barrier. On the other hand, the motor of the barrier operator may be activated so as to move the barrier in the opposite direction to close the barrier when the action is to close the barrier.

Figure 3:
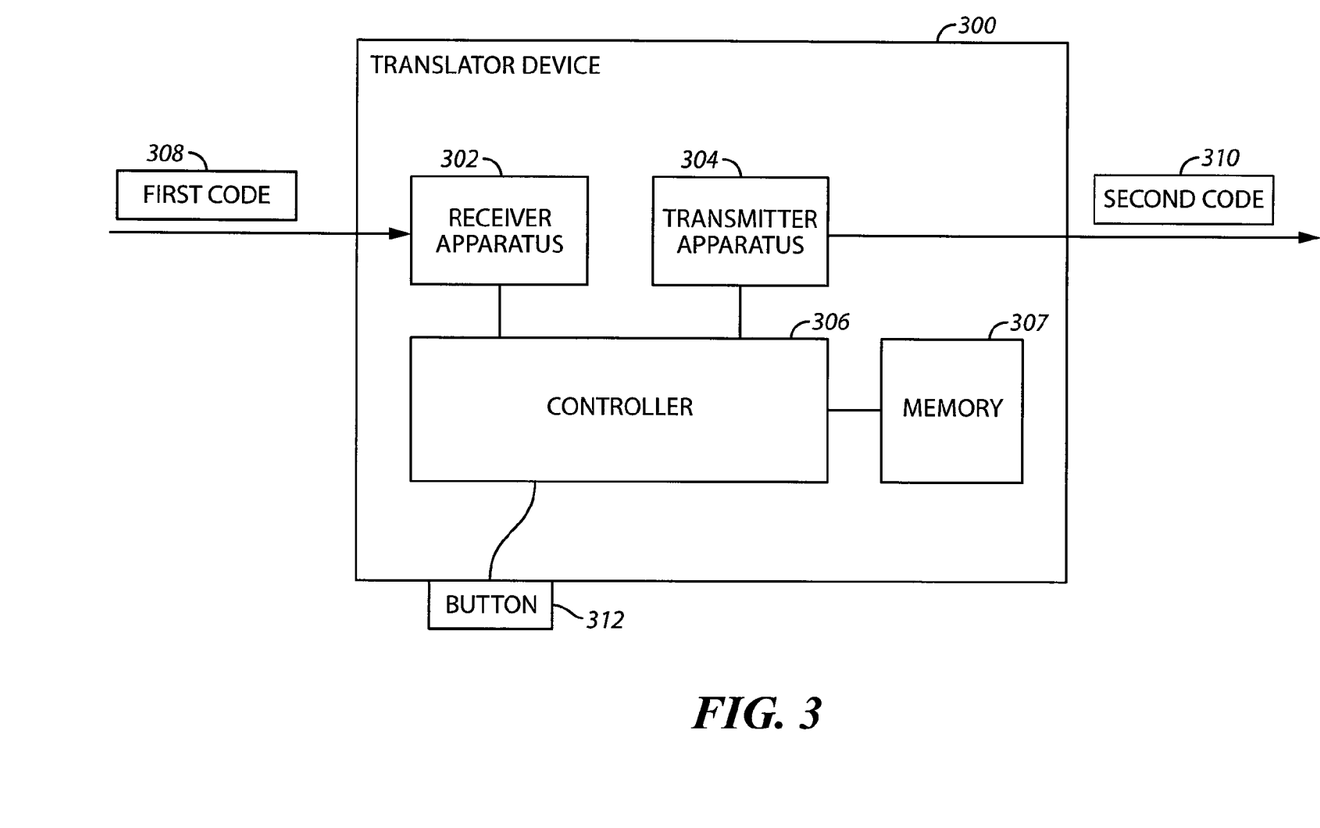
FIG. 3 comprises a block diagram of a code translator according to various embodiments of the present invention.

Referring now to FIG. 3, one example of a translator device 300 is described. The translator device 300 includes a receiver apparatus 302, a transmitter apparatus 304, a controller 306, and a memory 307. In one example, the translator device 300 is located in the vicinity of and nearby a portable transmitter (e.g., within a vehicle). In other examples, the translator device 300 may be located at a location remote from the portable transmitter. For example, the transmitter may be located within the vehicle and the translator device 300 may be located within a home or building.

In one example of the operation of the translator device 300, a first barrier actuation code 308 is received at the receiver apparatus 302. The controller 306 is programmed to verify that the first barrier actuation code 308 is a valid code. The first barrier actuation code 308 is stored in the memory 307. Whenever the first barrier actuation code 308 is verified to be a valid code, the controller 306 is programmed to determine a second code format and a second barrier actuation code 310 having the same or some of the same code information as the first barrier actuation code 308. In one example, the first barrier actuation code includes a fixed portion and the second barrier actuation code includes at least a portion derived from the fixed portion. In another example, the first barrier actuation code includes a rolling portion and the second barrier actuation code includes at least a portion derived from the rolling portion.

The controller 306 presents the second barrier actuation code 310 to the transmitter apparatus 304 and the transmitter apparatus 304 transmits the second barrier actuation code 310 in the second code format to a barrier operator. The barrier operator can then operate as directed by the second barrier actuation code.

In yet another approach, the translator device 300 has the ability to produce a message in a first code format when a button 312 (or some other actuator such as a switch) on the translator device 300 is actuated by a user. This first code format transmission is formed and transmitted by the translator device 300 and is used, for example, to program transmitters or transceivers in vehicles (or at other locations such as buildings) where the transmitter or transceiver is affixed or incorporated directly into the structure of the vehicle. After the programming of the transmitter or transceiver is accomplished, the button 312 on the translator device 300 is not used. The actuation of the button 312 may cause the transmission of information from the translator device 300 that programs the transmitter/transceiver without this information having the ability to operate or otherwise actuate any barrier operator. The transmitter may be programmed in a variety of different ways. For instance, the transmitter may be programmed to transmit certain codes or other types of information. Other examples of programming of the transmitter/transceiver may also be accomplished.

Thus, approaches are provided whereby a transmitter is used in association with a moveable barrier operator and operates effectively with the movable barrier operator even when the codes or code formats of the moveable barrier operator are updated or changed. The approaches described herein are easy and cost-effective to implement, use, and maintain while at the same time providing for the increased and desired security levels required by users. These approaches can also be seamlessly incorporated into existing systems without the need to extensively re-program or re-wire these existing systems.

Those skilled in the art will recognize that a wide variety of modifications, alterations, and combinations can be made with respect to the above described embodiments without departing from the spirit and scope of the invention, and that such modifications, alterations, and combinations are to be viewed as being within the scope of the invention.

What is claimed is:

1. A system for translating codes from a first format to operate a barrier operator system, the system comprising:
    a translator device configured to receive, using a pre-programmed native mode of operation comprising programming steps and/or utilized data and operational parameters that are present and available to the translator device without need for an end user to enter such content or for the translator device to acquire such content via a learning mode of operation, a first barrier actuation code transmitted by a transmitter according to a first code format, analyze the first barrier actuation code according to the first code format, verify that the first barrier actuation code is a valid code, and when the first barrier actuation code is verified to be a valid code saving the information contained in the code, creating a second barrier actuation code at least in part from information contained in the first actuation code, and transmit the second barrier actuation code according to the second code format, the second code format being different from the first code format; and a barrier operator coupled to the translator device and a barrier, the barrier operator having a receiver, the receiver receiving the second barrier actuation code transmitted according to the second code format from the translator device, the barrier operator determining whether the second barrier actuation code transmitted according to the second code format is valid, and when the barrier actuation code is determined to be valid, actuating the barrier.

2. The system of claim 1 wherein the translator device is coupled to and powered by a power source of a vehicle.

3. The system of claim 1 wherein the first code format is selected from a group comprising a trinary format; a rolling code format; and a Manchester format.

4. The system of claim 1 wherein the second code format is selected from a group comprising a trinary format; a rolling code format; and a Manchester format.

5. The system of claim 1 wherein the first barrier actuation code is transmitted at a first frequency and the second barrier actuation code is transmitted at a second frequency.

6. The system of claim 1 wherein the first barrier actuation code includes a fixed portion and wherein the second barrier actuation code includes at least a portion derived from the fixed portion.

7. The system of claim 1 wherein the first barrier actuation code includes a rolling portion and wherein the second barrier actuation code includes at least a portion derived from the rolling portion.

8. A method of operating a moveable barrier operator, the method comprising:

receiving, at a receiver operating in an operation mode, a first barrier actuation code transmitted from a transmitter, the first barrier actuation code transmitted according to a first code format;

verifying that the first barrier actuation code is a valid code;

in response to the first barrier actuation code being verified to be a valid code and while operating in the operation mode, saving the information contained in the valid code using a second code format and, in response to saving the information, forming a second barrier actuation code according to the second code format using at least a portion of the information contained in the first barrier actuation code; and subsequently transmitting the second barrier actuation code in the second code format to a barrier operator to actuate the barrier operator.

9. The method of claim 8 wherein the second code format is selected by a selector from a group of more than one code formats.

10. The method of claim 8 wherein first format is selected from a group comprising a trinary format; a rolling code format; and a Manchester format.

11. The method of claim 8 wherein second format is selected from a group comprising a trinary format; a rolling code format; and a Manchester format.

12. The method of claim 8 wherein the a first barrier actuation code is transmitted at a first frequency and comprising transmitting the second barrier actuation code at a second frequency.

13. The method of claim 8 wherein the first barrier actuation code includes a fixed portion and wherein the second barrier actuation code includes at least a portion derived from the fixed portion.

14. The method of claim 8 wherein the first barrier actuation code includes a rolling portion and wherein the second barrier actuation code includes at least a portion derived from the rolling portion.

15. The method of claim 8 comprising analyzing the second barrier actuation code at the barrier operator and operating the barrier operator according to the second barrier actuation code.

16. A device for transmitting codes to a barrier operator, the device comprising:

a receiver apparatus configured to operate in an operation mode and, when operating in the operation mode, to receive a first barrier actuation code being transmitted from a remote transmitter, the first barrier actuation code transmitted according to a first code format;

a transmitter apparatus; and a controller coupled to the receiver apparatus and the transmitter apparatus, the controller being programmed to, during operation in the operation mode, verify that the received first barrier actuation code is a valid code, and, in response to the first barrier actuation code being verified to be a valid code, based on the first barrier actuation code, to determine a second code format, save code information of the first barrier actuation code in the second code format, and to form a second barrier actuation code having at least a portion of the saved code information of the first barrier actuation code and to transmit the second barrier actuation code in the second code format to a barrier operator using the transmitter apparatus while operating in the operation mode.

17. The device of claim 16 wherein the controller is configured and arranged to determine the second code format that is selectable from one or more possible code formats.

18. The device of claim 16 wherein first format is selected from a group comprising a trinary format; a rolling code format; and a Manchester format.

19. The device of claim 16 wherein second format is selected from a group comprising a trinary format; a rolling code format; and a Manchester format.

20. The device of claim 16 wherein the first barrier actuation code is transmitted at a first frequency and wherein the controller is programmed to transmit the second barrier actuation code at a second frequency.

21. The device of claim 16 wherein the first barrier actuation code includes a fixed portion and wherein the second barrier actuation code includes at least a portion derived from the fixed portion.

22. The device of claim 16 wherein the first barrier actuation code includes a rolling portion and wherein the second barrier actuation code includes at least a portion derived from the rolling portion.

23. The device of claim 16 wherein the device is positioned with a vehicle.

24. The device of claim 16 wherein the device is positioned in a building in proximity to the barrier operator.

* * * * *

UNITED STATES PATENT AND TRADEMARK OFFICE
CERTIFICATE OF CORRECTION

Page 1 of 1

PATENT NO. : 9,177,430 B2
APPLICATION NO. : 11/948581
DATED : November 3, 2015
INVENTOR(S) : James J. Fitzgibbon et al.

It is certified that error appears in the above-identified patent and that said Letters Patent is hereby corrected as shown below:

IN THE CLAIMS:

Column 8, Claim 12, Line 4: Delete "the a" and insert -- the --, therefor.

Signed and Sealed this
Eighth Day of March, 2016

Michelle K. Lee
*Director of the United States Patent and Trademark Office*